United States Patent
Kousai (10) Patent No.: US 9,197,176 B2
(45) Date of Patent: Nov. 24, 2015

(54) AMPLIFICATION DEVICE AND TRANSMITTER

(71) Applicant: KABUSHIKI KAISHA TOSHIBA, Minato-ku (JP)

(72) Inventor: Shouhei Kousai, Yokohama (JP)

(73) Assignee: Kabushiki Kaisha Toshiba, Minato-Ku, Tokyo (JP)

(*) Notice: Subject to any disclaimer, the term of this patent is extended or adjusted under 35 U.S.C. 154(b) by 52 days.

(21) Appl. No.: 14/021,529

(22) Filed: Sep. 9, 2013

(65) Prior Publication Data
US 2014/0285266 A1   Sep. 25, 2014

(30) Foreign Application Priority Data

Mar. 22, 2013  (JP) .................................. 2013-59955

(51) Int. Cl.
| | | |
|---|---|---|
| H03F 3/191 | (2006.01) | |
| H03G 3/20 | (2006.01) | |
| H03H 7/38 | (2006.01) | |
| H04B 1/04 | (2006.01) | |
| H03F 1/56 | (2006.01) | |

(52) U.S. Cl.
CPC .. H03G 3/20 (2013.01); H03F 1/56 (2013.01); H03H 7/38 (2013.01); H04B 1/04 (2013.01)

(58) Field of Classification Search
CPC ............. H04B 1/04; H03H 7/38; H03G 3/20; H04L 5/16; H03F 3/16
USPC .............. 455/114, 126, 127; 330/51, 69, 124, 330/133, 136, 277, 279, 295, 305, 144, 330/284; 375/219
See application file for complete search history.

(56) References Cited

U.S. PATENT DOCUMENTS

| | | | |
|---|---|---|---|
| 6,414,562 B1* | 7/2002 | Bouisse et al. ................... | 333/32 |
| 7,358,807 B2 | 4/2008 | Scuderi et al. | |
| 7,486,137 B2 | 2/2009 | Magoon et al. | |
| 7,764,125 B2* | 7/2010 | Dawe ............................ | 330/305 |
| 7,860,466 B2* | 12/2010 | Woo et al. .................. | 455/114.3 |
| 2011/0235689 A1 | 9/2011 | Kousai | |
| 2012/0188018 A1* | 7/2012 | Yahav et al. .................. | 330/278 |
| 2013/0214867 A1 | 8/2013 | Kousai | |

FOREIGN PATENT DOCUMENTS

| | | |
|---|---|---|
| JP | 2009-301747 A | 12/2009 |
| JP | 2010-062997 A | 3/2010 |
| JP | 2011-101111 A | 5/2011 |

OTHER PUBLICATIONS

Hang et al., "A CMOS Adaptive Antenna-Impedance-Tuning IC Operating in the 850MHz-to-2GHz Band", IEEE ISSCC, pp. 384-385, Feb. 2009.

(Continued)

*Primary Examiner* — Steven J Mottola
*Assistant Examiner* — Hafizur Rahman
(74) *Attorney, Agent, or Firm* — White & Case LLP (57) ABSTRACT

According to one embodiment, an amplification device includes an input terminal into which an input signal is inputted, a first amplifier, an output terminal, a variable impedance module connected at an output end of the first amplifier, a second amplifier, a reference impedance element connected at an output end of the second amplifier, a magnitude comparator, a phase comparator, and a controller. The controller is configured to control impedance of the variable impedance module so that impedance at a point between the first amplifier and the variable impedance approaches a first value.

9 Claims, 8 Drawing Sheets

(56) References Cited

OTHER PUBLICATIONS

Kevin R. Boyle et al., "Analysis of Mobile Phone Antenna Impedance Variations With User Proximity", IEEE Transaction on Antennas and Propagation, vol. 55, No. 2, pp. 364-372, Feb. 2007.

Andre van Bezooijen et al., "A GSM/EDGE/WCDMA Adaptive Series-LC Matching Network Using RF-MEMS Switches", IEEE JSSC, vol. 43, No. 10, pp. 2259-2268, Oct. 2008.

Japanese Office Action issued Jun. 9, 2015 in Japanese Patent Application No. 2013-059955, with English translation.

* cited by examiner

AMPLIFICATION DEVICE AND TRANSMITTER

CROSS REFERENCE TO RELATED APPLICATIONS

This application is based upon and claims the benefit of priority from the prior Japanese Patent Application No. 2013-59955 filed on Mar. 22, 2013, the entire contents of which are incorporated herein by reference.

FIELD

Embodiments described herein relate generally to an amplification device and a transmitter.

BACKGROUND

Generally, amplification devices such as power amplifiers are designed so that the efficiency becomes the highest when the impedance of a connected load is 50Ω. However, the impedance of the load is not always constant when actually used. Therefore, if the impedance is far from 50Ω, the efficiency may be decreased.

BRIEF DESCRIPTION OF THE DRAWINGS

FIG. 4 is a block diagram showing a schematic configuration of the amplification device 10a.

DETAILED DESCRIPTION

In general, according to one embodiment, an amplification device includes an input terminal into which an input signal is inputted, a first amplifier, an output terminal, a variable impedance module connected at an output end of the first amplifier, a second amplifier, a reference impedance element connected at an output end of the second amplifier, a magnitude comparator, a phase comparator, and a controller.

The first amplifier is configured to amplify the input signal to generate a first output signal The output terminal is configured to output the first output signal to a load. The second amplifier is configured to amplify the input signal to generate a second output signal. The magnitude comparator is configured to generate a magnitude comparison signal according to a comparison result between a magnitude of the first output signal and a magnitude of the second output signal. The phase comparator is configured to generate a phase comparison signal according to a comparison result between a phase of the first output signal and a phase of the second output signal.

The controller is configured to, based on the magnitude comparison signal and the phase comparison signal, control impedance of the variable impedance module so that impedance at a point between the first amplifier and the variable impedance approaches a first value.

Embodiments will now be explained with reference to the accompanying drawings.

First Embodiment

Figure 1:
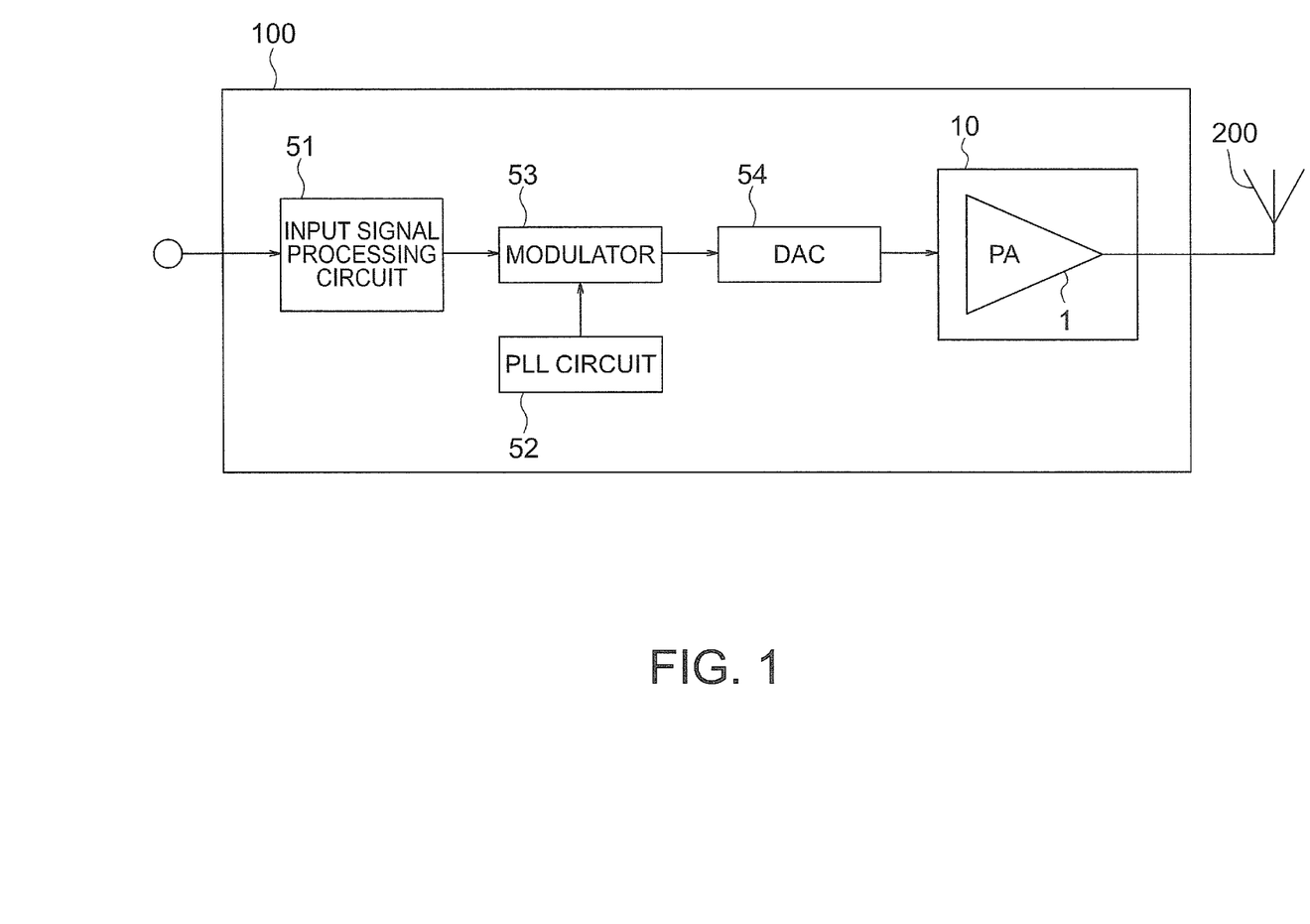
FIG. 1 is a block diagram showing a schematic configuration of the transmitter 100.

FIG. 1 is a block diagram showing a schematic configuration of the transmitter 100. The transmitter 100 is mounted on a cellular phone, for example. The transmitter 100 outputs, to an antenna 200, a radio signal obtained by processing an input signal inputted from a baseband LSI (Large Scale Integrated circuit, not shown) and so on. More specifically, the transmitter 100 has an input signal processing circuit 51, a PLL circuit (local oscillation signal generation circuit) 52, a modulator 53, a D-A converter (DAC) 54, and an amplification device 10.

The input signal processing circuit 51 processes a signal inputted from an outside. The PLL circuit 52 includes a VCO (Voltage Controlled Oscillator) to generate an LO signal. The modulator 53 modulates the output signal from the input signal processing circuit 51 based on the LO signal. The D-A converter 54 converts a digital signal outputted from the modulator 53 to an analog signal. The amplification device 10 includes a power amplifier (PA) 1 and amplifies the analog signal outputted from the D-A converter 54 to output the amplified signal to the antenna 200.

Here, the power amplifier 1 in the amplification device 10 is designed so that the loss is small and the efficiency becomes the highest when the impedance of a connected load is 50Ω. The connected load is mainly formed of the antenna 200 connected at the output terminal of the amplification device 10. However, even if the impedance of the antenna 200 is 50Ω, the impedance may vary by touching the antenna 200 by the user when actually used.

Then, in the present embodiment, a variable impedance module is provided in the amplification device 10, and the impedance of the load connected to the power amplifier 1 is adjusted so that the impedance becomes 50Ω to a maximum extent.

Figure 2:
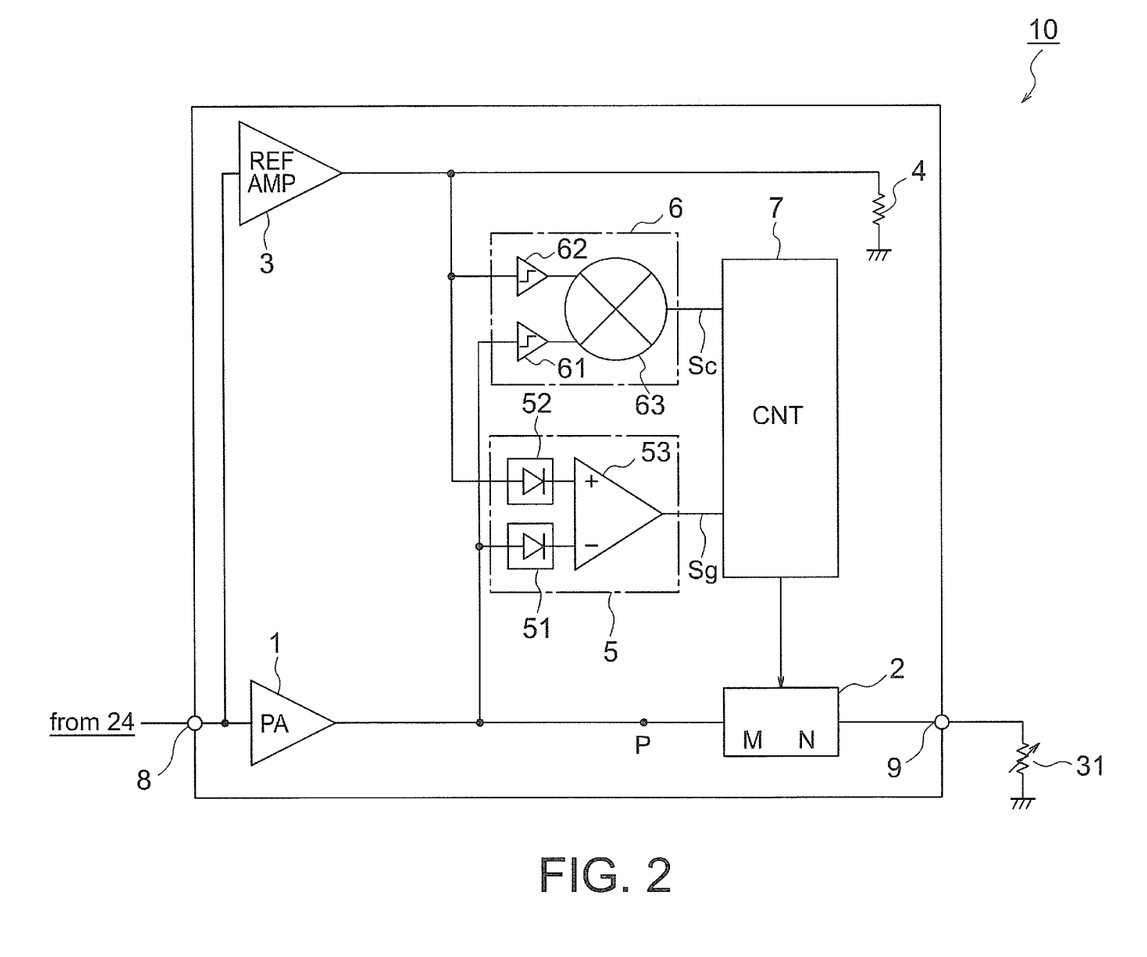
FIG. 2 is a block diagram showing a schematic configuration of the amplification device 10.

FIG. 2 is a block diagram showing a schematic configuration of the amplification device 10. The amplification device 10 has a power amplification 1, a matching network circuit (MN) 2, a reference amplifier (REF AMP) 3, a resistance element 4, a magnitude comparator 5, a phase comparator 6, a controller 7, an input terminal 8, and an output terminal 9.

An analog signal from the DAC 54 is inputted to the input terminal 8 as an input signal. The input signal may be a single phase signal or may be a differential signal.

The antenna 200 is connected to the output terminal 9. As described above, the impedance of the load connected to the output terminal 9 of the amplification device 10 is not constant. Therefore, the load is schematically drawn as a variable resistance element 31.

The power amplifier 1 (first amplifier) amplifies the input signal. As described above, the efficiency becomes the highest when the impedance of the connected load is 50Ω.

The matching network circuit 2 (variable impedance module) is connected at an output end of the power amplifier 1. The impedance of the matching network circuit 2 is variably-controlled by the controller 7.

When seen from the power amplifier 1, the matching network circuit 2 and the load 31 at outside are serially-connected at the output end of the power amplifier 1. Therefore, the efficiency of the power amplifier 1 becomes the highest when the impedance of the output end of the power amplifier 1, more specifically, the impedance at a point "P" between the power amplifier 1 and the matching network circuit 2 is 50Ω. Accordingly, the impedance of the matching network circuit 2 is controlled so that the impedance at the point "P" becomes 50Ω. Here, the impedance at the point "P" is also a combined impedance of the serially-connected matching network circuit 2 and the load 31.

The reference amplifier 3 (second amplifier) amplifies the input signal. In the present embodiment, the reference amplifier 3 is designed so that the input-output characteristics of the reference amplifier 3 are substantially the same as those of the power amplifier 1. Since both of the power amplifier 1 and the reference amplifier 3 are in the amplification device 10, the temperature characteristics of the power amplifier 1 are substantially the same as those of the power amplifier 1, and the power source voltage of the reference amplifier 3 is substantially the same as that of the power amplifier 1. Therefore, if the temperature and/or the power supply voltage vary in some degree, the input-output characteristics of the reference amplifier 3 are substantially the same as those of the power amplifier 1.

The resistance element 4 (reference impedance element) is connected at an output end of the reference amplifier 3. The resistance element 4 is a load which makes the efficiency of the reference amplifier 3 the maximum, specifically, is a resistance element having an impedance of 50Ω. In the present embodiment, the resistance element 4 can also be a load which makes the efficiency of the power amplifier 1 the maximum.

The magnitude comparator 5 generates a magnitude comparison signal Sg according to a comparison result between the magnitude of the output signal from the power amplifier 1 and that of the output signal from the reference amplifier 3. As an example, the magnitude comparator 5 has magnitude detection circuits 51, 52 and an operation amplifier 53.

The magnitude detection circuit 51 detects the amplification of the output signal from the power amplifier 1, to supply a voltage corresponding to the amplification to an inverted input terminal of the operation amplifier 53. The magnitude detection circuit 52 detects the amplification of the output signal from the reference amplifier 3, to supply a voltage corresponding to the amplification to a non-inverted input terminal of the operation amplifier 53. The operation amplifier 53 amplifies the difference between the voltages to generate the magnitude comparison signal Sg. The magnitude comparison signal Sg is, for example, a voltage corresponding to the magnitude of the output signal from the power amplifier 1 and that of the output signal from the reference amplifier 3.

The phase comparator 6 generates a phase comparison signal Sc according to a comparison result between the phase of the output signal form the power amplifier 1 and that of the output signal form the reference amplifier 3. As an example, the phase comparator 6 has limiter circuits 61, 62 and a mixer circuit 63. The limiter circuit 61 supplies the mixer circuit 63 with a voltage obtained by limiting the magnitude of the output signal from the power amplifier 1 by a predetermined setting value. The limiter circuit 62 supplies the mixer circuit 63 with a voltage obtained by limiting the magnitude of the output signal from the reference amplifier 3 by the predetermined setting value. The mixer circuit 63 mixes the voltages to generate the phase comparison signal Sc. The phase comparison signal Sc is, for example, a voltage corresponding to the difference between the phase of the output signal from the power amplifier 1 and that of the output signal from the reference amplifier 3.

The controller 7 controls the impedance of the matching network circuit 2 so that the impedance at the point "P" approach the predetermined 50Ω based on the magnitude comparison signal Sg and the phase comparison signal Sc. More specific explanation is as followings. Since the resistance element 4 is connected at the output end of the reference amplifier 3, the magnitude and the phase of the output signal therefrom are those when the efficiency becomes the maximum. Furthermore, in the present embodiment, the input-output characteristics of the power amplifier 1 are substantially the same as those of the reference amplifier 3.

Therefore, the controller 7 adjusts the impedance of the matching network circuit 2 so that the magnitude and the phase of the output signal from the power amplifier 1 approach those of the output signal from the reference amplifier 3. Based on the magnitude comparison signal Sg and the phase comparison signal Sc, it is possible to determine that the magnitude and the phase of the output signal from the power amplifier 1 approach those of the output signal from the reference amplifier 3. By such a manner, the impedance at the point "P" becomes substantially 50Ω, and thus, the operation of the power amplifier 1 is optimized.

Figure 3:
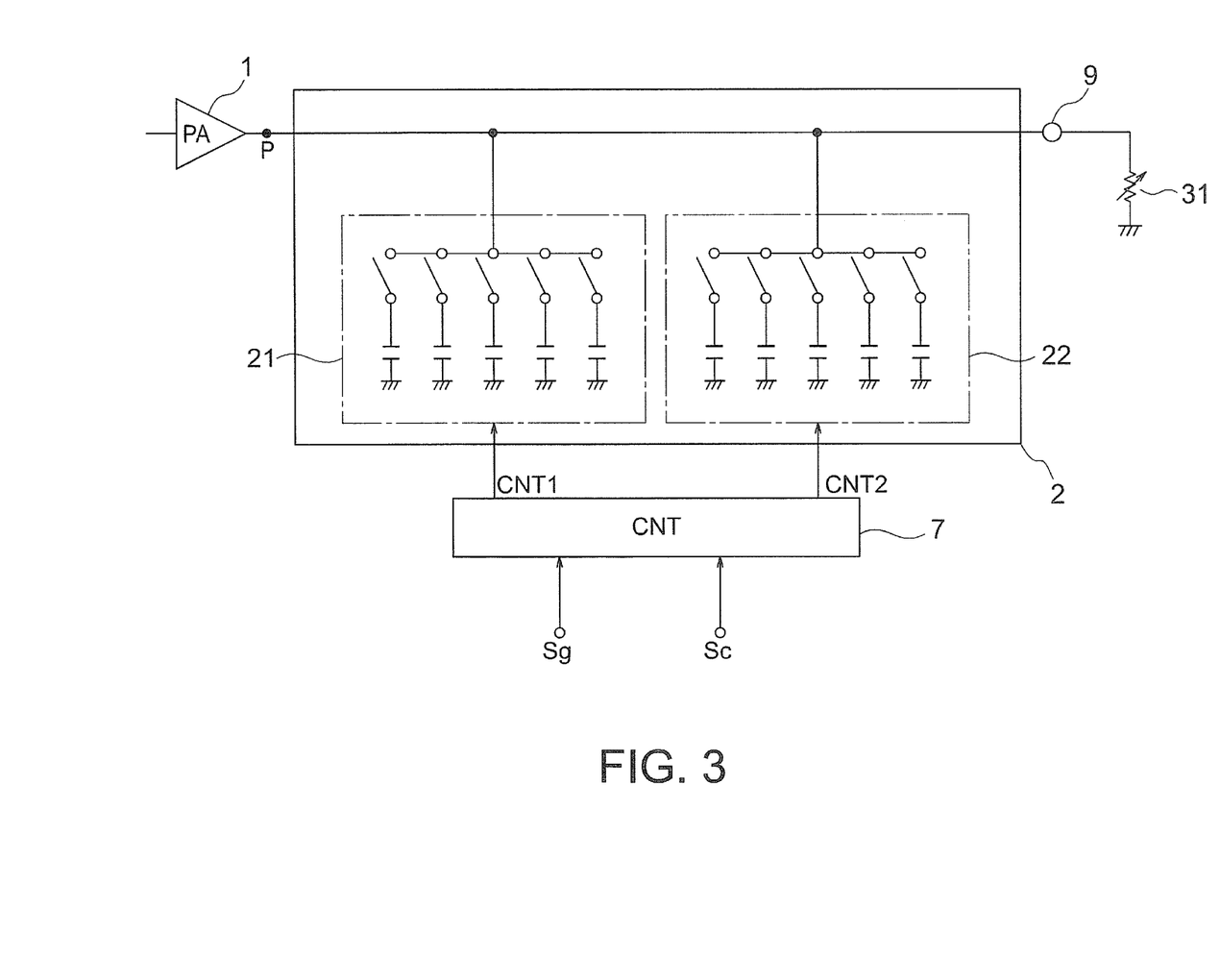
FIG. 3 is a diagram showing an example of an internal configuration of the matching network circuit 2.

FIG. 3 is a diagram showing an example of an internal configuration of the matching network circuit 2. The matching network circuit 2 has variable capacitance modules 21, 22. One end of the variable capacitance module 21 is connected at one end closer to the power amplifier 1 of a line which connects the power amplifier 1 to the output terminal 9, and the other end of the variable capacitance module 21 is grounded. One end of the variable capacitance module 22 is connected at the other end closer to the output terminal 9 of the line, and the other end of the variable capacitance module 22 is grounded. Each of the variable capacitance modules 21, 22 include, for example, pairs formed by a capacitance and switch, and the pairs are parallel-connected. The switches in the variable capacitance modules 21, 22 are controlled by control signals CNT1, CNT2 from the controller 7. As the number of the switch which is set "on" is larger, the capacitance becomes larger.

Depending on the capacitance of the variable capacitance modules 21, 22, the magnitude and the phase of the output signal from the power amplifier 1 vary. The relationship between the capacitance of the variable capacitance modules 21, 22 and the magnitude and the phase of the output signal from the power amplifier 1 is previously known by a simulation and so on. That is, for various magnitude comparison signal Sg and phase comparison signal Sc, how the control signals CNT1, CNT2 should be set in order to make the impedance at the point "P" 50Ω is previously known.

Then, the controller 7 converts the magnitude comparison signal Sg and the phase comparison signal Sc to the control signals CNT1, CNT2. This conversion processing can be realized by previously storing the relationship between the inputted signals Sg, Sc and the outputted control signals CNT1, CNT2 in a table. The switches in the variable capacitance modules 21, 22 are controlled so that the impedance at the point "P" becomes 50Ω by the control signals CNT1, CNT2 obtained by the conversion processing.

By such a control, the controller 7 can variably-control the impedance of the matching network circuit 2. By providing two variable capacitance modules 21, 22, the complex impedance can be flexibly adjusted. As a result, the impedance at the point "P" can be set to be 50Ω.

Note that, the matching network circuit 2 shown in FIG. 3 is only an example, and various modified circuits can be conceivable.

As stated above, in the first embodiment, the impedance of the load connected at the output end of the power amplifier 1 is controlled to be 50Ω by comparing the magnitude and the phase of the output signal from the power amplifier 1 and those of the output signal from the reference amplifier 3 to which the resistance element 4 having 50Ω is connected. Therefore, even when the impedance of the load 31 varies, it is possible to suppress the degradation of the efficiency of the power amplifier 1.

Second Embodiment

In the above described first embodiment, the reference amplifier 3 having input-output characteristics which are same as those of the power amplifier 1 is used. On the other hand, in a second embodiment explained below, the reference amplifier 3a whose power consumption is lower than that of the power amplifier 1 is used.

Figure 4:
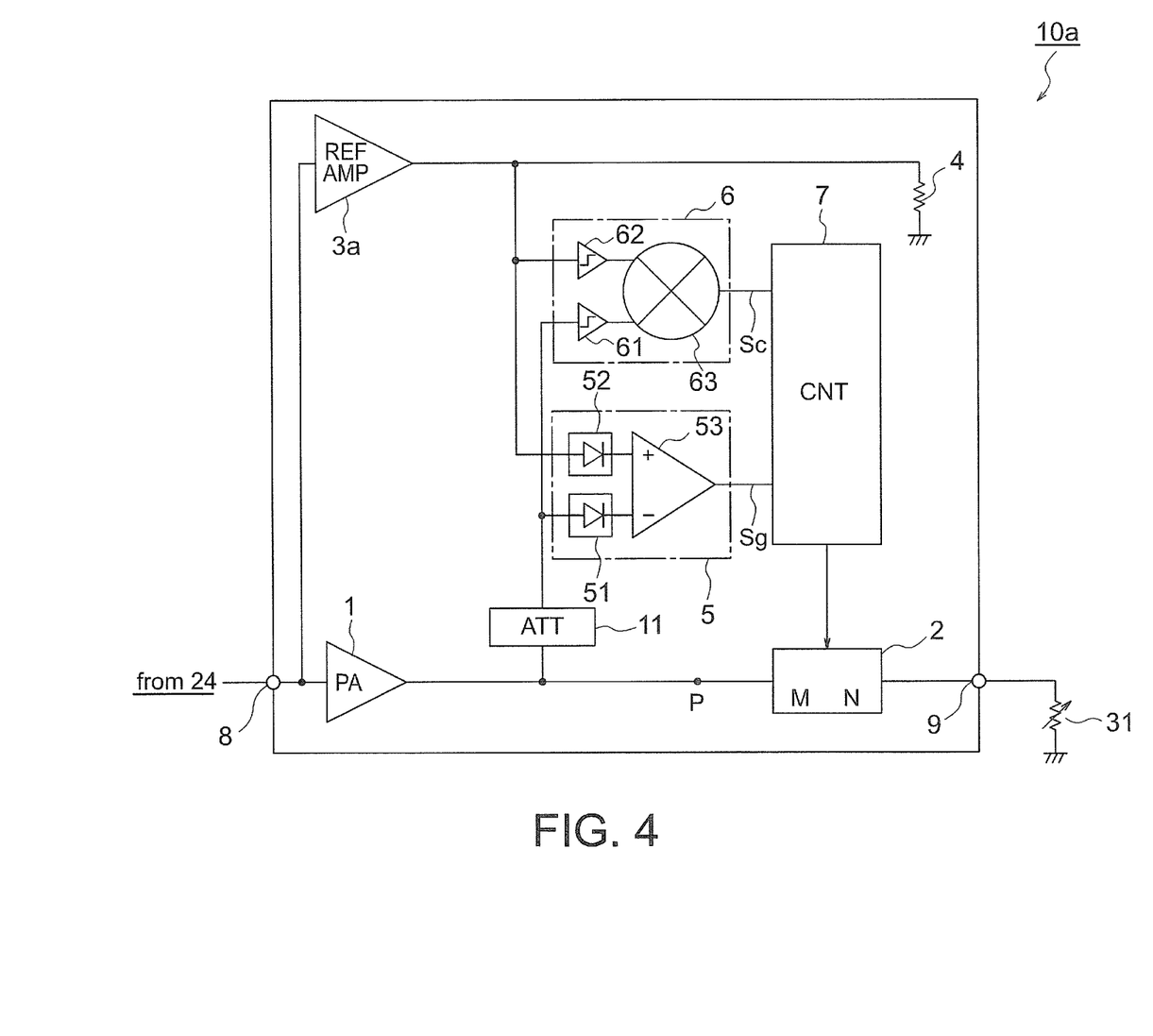

FIG. 4 is a block diagram showing a schematic configuration of the amplification device 10a. In FIG. 4, components common to those of FIG. 2 have common reference numerals, respectively. Hereinafter, differences from FIG. 2 will be mainly described below.

The power consumption of the reference amplifier 3a in the amplification device 10a of FIG. 4 is lower than that of the power amplifier 1. In this case, the amplification gain of the reference amplifier 3a is lower than that of the power amplifier 1. Here, the amplification gain of the power amplifier 1 and that of the reference amplifier 3a are assumed to be Apa and Aref, respectively, and Aref<Apa. Note that, in the present embodiment, it is assumed that the input-output characteristic about the phase of the power amplifier 1 is the same as that about the phase of the reference amplifier 3a.

Furthermore, it is also possible to use the resistance element 4 having a resistance larger than 50Ω for the purpose of further reduction of the power consumption.

The amplification device 10 of FIG. 4 has an attenuator (ATT) 11 located between the power amplifier 1 and the magnitude comparator 5. The attenuator 11 attenuates the magnitude of the output signal from the power amplifier 1 to Aref/Apa, and supplies the attenuated signal to the magnitude comparator 5. Therefore, it is possible to cancel the difference between the amplification gain of the power amplifier 1 and that of the reference amplifier 3a at the attenuator 11.

The operation of the controller 7 is similar to that explained in the first embodiment. That is, the controller 7 controls the impedance of the matching network circuit 2 so that the attenuated magnitude of the output signal from the power amplifier 1 approaches the magnitude of the output signal form the reference amplifier 3a. As a result, the amplification gain of the power amplifier 1 approaches Apa, and thus, the impedance at the point "P" approaches 50Ω.

As stated above, in the second embodiment, the reference amplifier 3 whose power consumption is lower than that of the power amplifier 1 is used. Therefore, the total power consumption of the amplification device 10a can be reduced. Furthermore, since the attenuator 11 is provided between the power amplifier 1 and the magnitude comparator 5, the impedance of the matching network circuit 2 can be controlled so as not decrease the efficiency of the amplification device 10a even if the amplification gain of the power amplifier 1 is different from that of the reference amplifier 3a.

Third Embodiment

In the above described second embodiment, it is assumed that the input-output characteristic about the phase of the power amplifier 1 is the same as that about the phase of the reference amplifier 3a. On the other hand, a third embodiment which will be explained below relates to a case where the input-output characteristic about phase is different from each other.

When the reference amplifier 3a whose power consumption is lower than that of the power amplifier 1 is used, the input-output characteristic about phase of the reference amplifier 3a may be different from those about the phase of the power amplifier 1 due the difference of the amplification gains. This is because there may be parasite capacitance and inductor components on the resistance element 4 connected to the reference amplifier 3a. In this case, even if the real part of the impedance at the point "P" is set to be 50Ω, the imaginary part thereof may not be zero due to the phase difference between the output signal from the power amplifier 1 and that from the reference amplifier 3a. As a result, the power amplifier 1 may not operate at the optimum state.

Therefore, the present embodiment intends to cancel the phase difference at the phase comparator 6. Note that, since the configuration of the amplification device is similar to that shown in FIG. 4, the figure is omitted.

It is assumed that the phase difference between the input signal and the output signal for the power amplifier 1 is θpa, and that for the reference amplifier 3a is θref. In this case, there is an offset dθ=θpa−θref between the power amplifier 1 and the reference amplifier 3a. Hereinafter, a circuit for canceling the offset will be explained.

Figure 5:
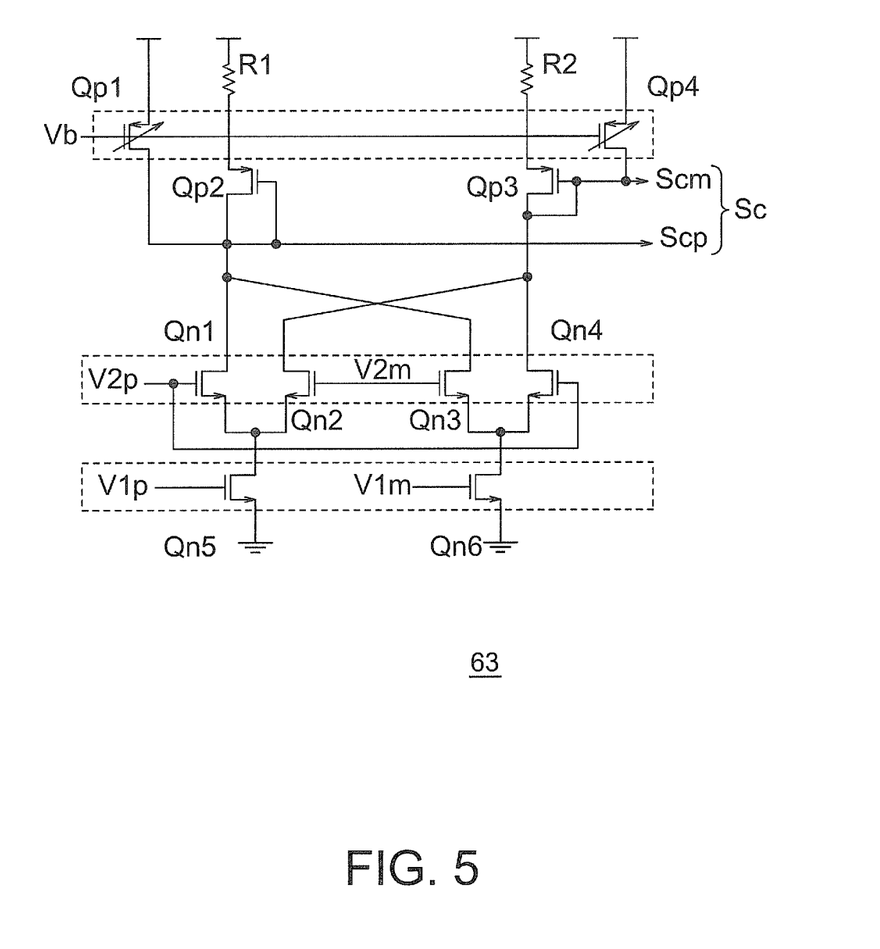
FIG. 5 is a circuit diagram showing an example of the mixer circuit 63 in the phase comparator 6.

FIG. 5 is a circuit diagram showing an example of the mixer circuit 63 in the phase comparator 6. In this example, it is assumed that the output signals from the power amplifier 1 and the reference amplifier 3a are differential signals. The mixer circuit 63 has pMOS transistors Qp1 to Qp4, nMOS transistors Qn1 to Qn6, and resistance elements R1, R2.

The resistance R1 and transistors Qp2, Qn1, Qn5 are connected in series between a power source terminal and a ground terminal. The gate of the transistor Qp2 and the drain thereof are short-circuited with each other and output a phase comparison signal Scp. Similarly, the resistance R2 and transistors Qp3, Qn4, Qn6 are connected in series between the power source terminal and the ground terminal. The gate of the transistor Qp3 and the drain thereof are short-circuited and output a phase comparison signal Scm.

The source of the transistor Qp1 is connected to the power source terminal and the drain thereof is connected to the drain of the transistor Qp2. Similarly, the source of the transistor Qp4 is connected to the power source terminal and the drain thereof is connected to the drain of the transistor Qp3.

The drain and the source of the transistor Qn2 are connected to the drain of the transistor Qp3 and the drain of the transistor Qn5, respectively. Similarly, the drain and the source of the transistor Qn3 are connected to the drain of the transistor Qp2 and the drain of the transistor Qn6, respectively. Furthermore, the gate of the transistor Qn2 and the gate of the transistor Qn3 are short-circuited with each other.

The outputs V1p, V2p from the limiter circuit 61 are inputted to the gates of the transistors Qn5 and Qn6, respectively. The output V2p from the limiter circuit 62 is inputted to the gates of the transistors Qn1 and Qn4.

The gate of the transistor Qp1 and the gate of the transistor Qp4 are short-circuited with each other and are inputted with a bias signal Vb. In the mixer circuit 63 shown in FIG. 5, the phase comparison signal Sc becomes zero when dθ=θpa−θref=π/2. Here, by adjusting gate widths of the transistors Qp1 and Qp4 properly, the offset dθ can be canceled. For example, when dθ=θpa−θref>π/2, the gate width of the transistor Qp1 should be smaller than that of the transistor Qp4.

By such a manner, the phase comparison signal Sc, where the offset dθ caused by the difference of the input-output characteristics of the power amplifier 1 and those of the reference amplifier 3a has been canceled, is inputted to the controller 7. Therefore, the controller 7 can control the impedance of the matching network circuit 2 similar to the first embodiment.

Note that, in FIG. 5, the output V1p from the limiter circuit 61 may be inputted to the gates of the transistors Qn1, Qn4, and the output Vim from the limiter circuit 61 may be inputted to the gates of the transistors Qn2, Qn3. In this case, the outputs V2p, V2m from the limiter circuit 62 are inputted to the gates of the transistors Qn5, Qn6, respectively.

As stated above, in the third embodiment, the phase offset is adjusted at the mixer circuit 63. Therefore, it is possible to suppress the reduction of the efficiency of the power amplifier 1 even when the phase characteristic of the power amplifier 1 and that of the reference amplifier 3a are different from each other.

Fourth Embodiment

In the above described first to third embodiment, reference amplifier 3, 3a is used. On the other hand, in a fourth embodiment, the impedance is adjusted without using the reference amplifier.

Figure 6:
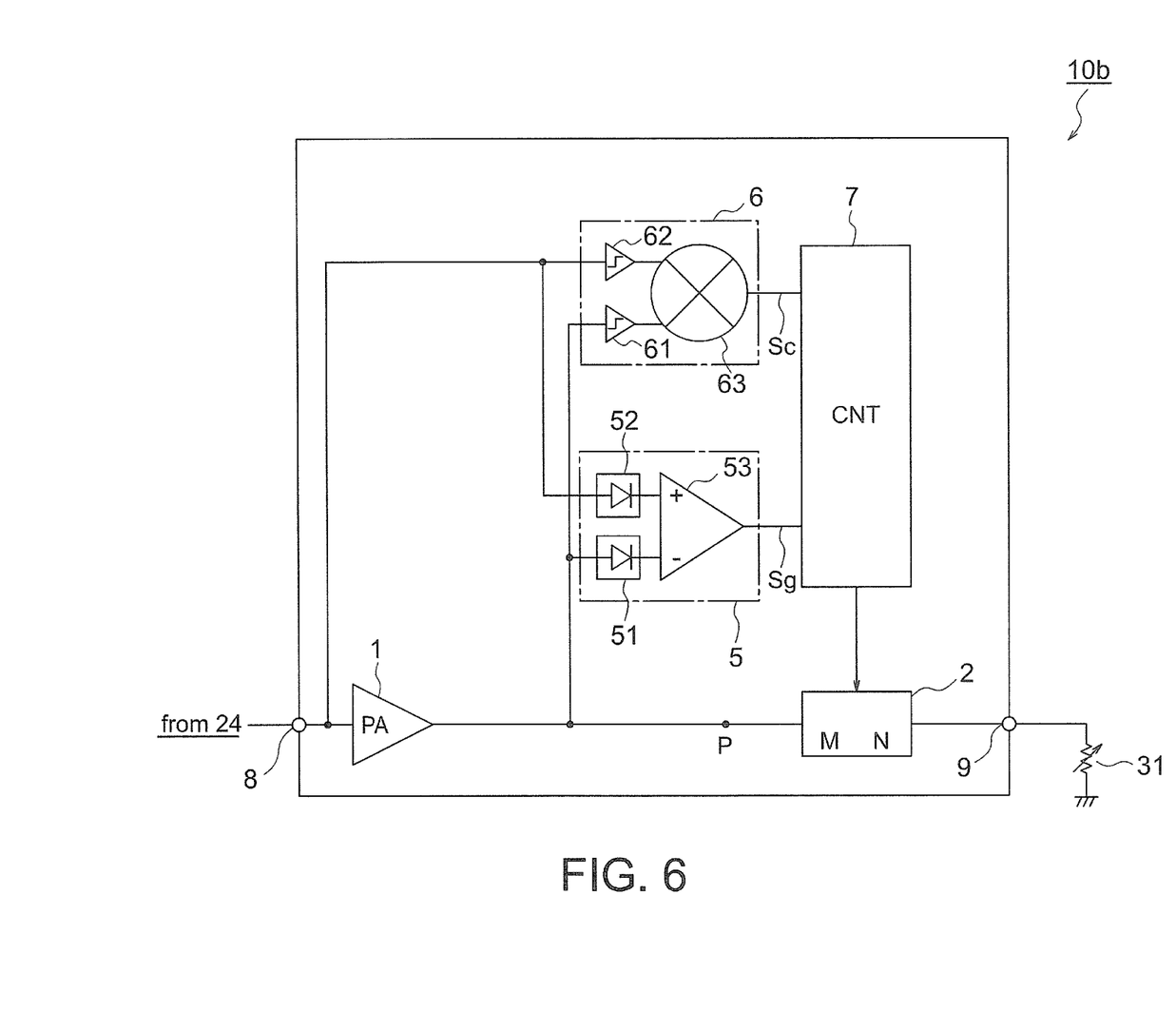
FIG. 6 is a block diagram showing a schematic configuration of the amplification device 10b.

FIG. 6 is a block diagram showing a schematic configuration of the amplification device 10b. In FIG. 6, components common to those of FIG. 2 have common reference numerals, respectively. Hereinafter, differences from FIG. 2 will be mainly described below.

In the amplification device 10b of FIG. 6, the input signal inputted to the input terminal 8 is inputted to the magnitude comparator 5 and the phase comparator 6. Then, the magnitude comparator 5 generates the magnitude comparison signal Sg according to the comparison result between the magnitude of the output signal from the power amplifier 1 and that of the input signal. Similarly, the phase comparator 6 generates the phase comparison signal Sc according to the comparison result between the phase of the output signal from the power amplifier 1 and that of the input signal.

Here, the controller 7 knows reference values of the magnitude comparison signal Sg and the phase comparison signal Sc. The reference values means values of the magnitude comparison signal Sg and the phase comparison signal Sc when the impedance of the load 31 connected at the output end of the power amplifier 1 is 50Ω.

Therefore, when the load 31 varies and the magnitude comparison signal Sg and the phase comparison signal Sc are shifted from the reference values, the controller 7 controls the impedance of the matching network circuit 2 so that this shift becomes small.

As stated above, in the fourth embodiment, the reference amplifier is not used. Therefore, the efficiency of the power amplifier 1 can be optimized with more simple circuit. Specifically, the present embodiment is effective when temperature and power source voltage seldom vary or when the power amplifier 1 does not suffer from the influence of the variation of the temperature and power source voltage.

Fifth Embodiment

In a fifth embodiment described below, a power amplifier 1 whose gate width is variable is used for the first to third embodiment.

Figure 7:
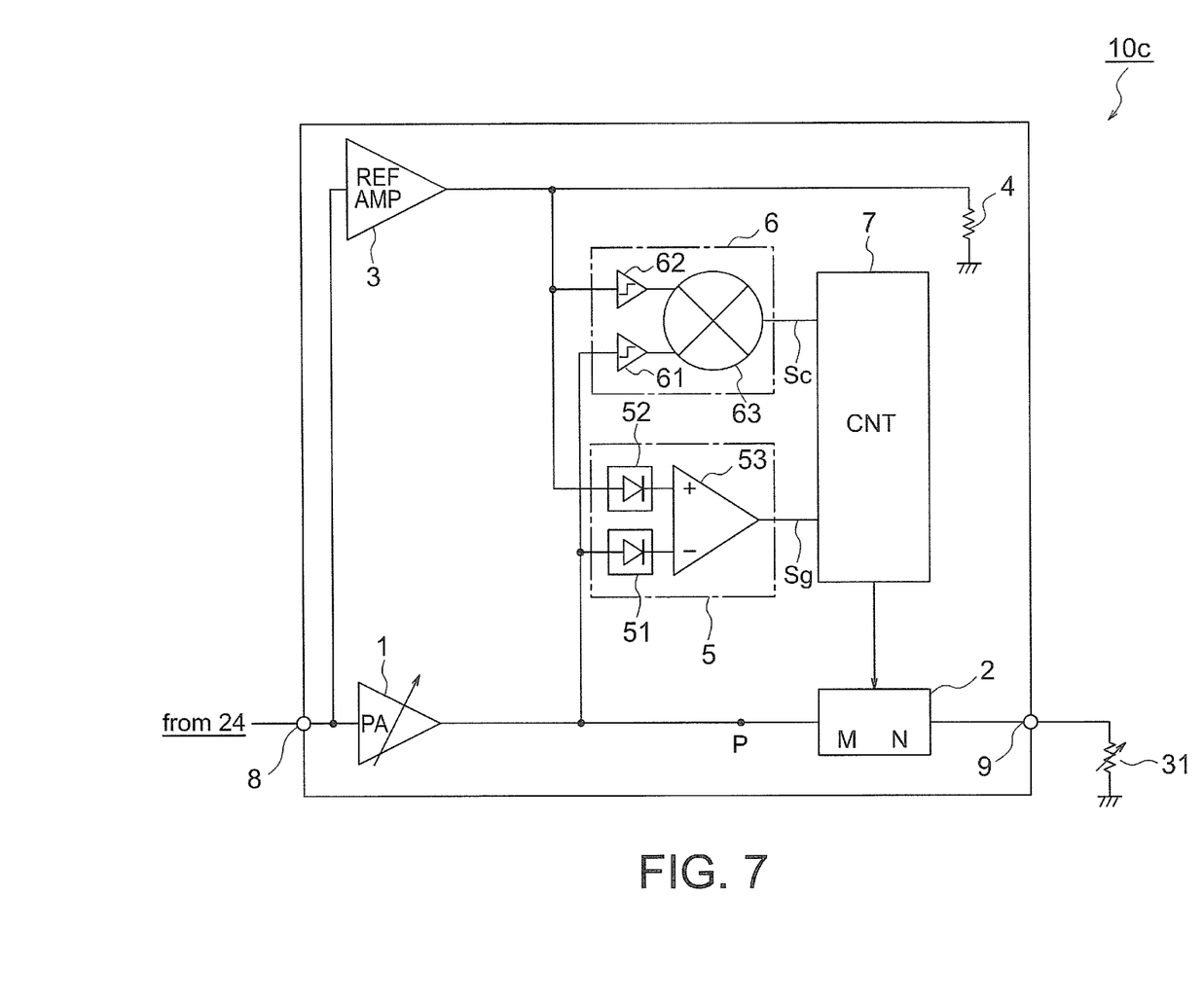
FIG. 7 is a block diagram showing a schematic configuration of the amplification device 10c.

FIG. 7 is a block diagram showing a schematic configuration of the amplification device 10c. As shown in FIG. 7, the gate width of the power amplifier 1 is variable. When high output power is needed, the gate width is set large. On the other hand, low output power can be enough, the gate width is set small. Note that, although FIG. 7 is an example where the power amplifier having a variable gate width is used in the amplification device 10 of FIG. 2, the power amplifier having a variable gate width can be used in the amplification devices of FIG. 4, FIG. 6 and so on.

Figure 8:
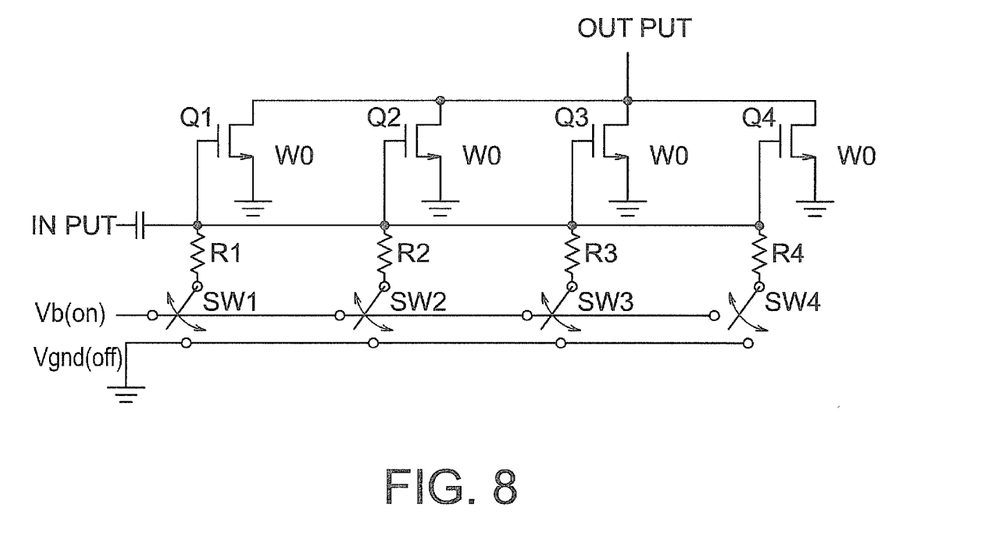
FIG. 8 is a diagram showing an example of a circuit for varying the gate width, the circuit being included in the power amplifier 1.

FIG. 8 is a diagram showing an example of a circuit for varying the gate width, the circuit being included in the power amplifier 1. As shown in FIG. 8, transistors Q1 to Q4 each having gate width W0 are connected in parallel. A bias voltage Vb or a ground voltage Vgnd is supplied to each of the gates of transistors Q1 to Q4 through resistors R1 to R4 and switches SW1 to SW4, respectively.

Then, current flows only in the transistor(s) to which the bias voltage Vb is supplied. For example, when the bias voltage Vb is supplied to the transistor Q1 and the ground voltage Vgnd is supplied to the remaining transistors Q2 to Q4, current flows only in the transistor Q1. This means that the gate width of the power amplifier 1 is substantially W0.

On the other hand, the bias voltage Vb is supplied to all the transistors Q1 to Q4, current flows in the transistors Q1 to Q4. This means that the gate width of the power amplifier 1 is substantially 4W0.

As stated, the gate width of the power amplifier 1 can be substantially variably-controlled, and thus, desired output power can be obtained. FIG. 8 is only an example, and gate width can be variably-controlled by various circuits.

Here, it is known that the optimum impedance Z of the load 31 seen from the power amplifier 1 depends on the gate width Z.

Figure 9:
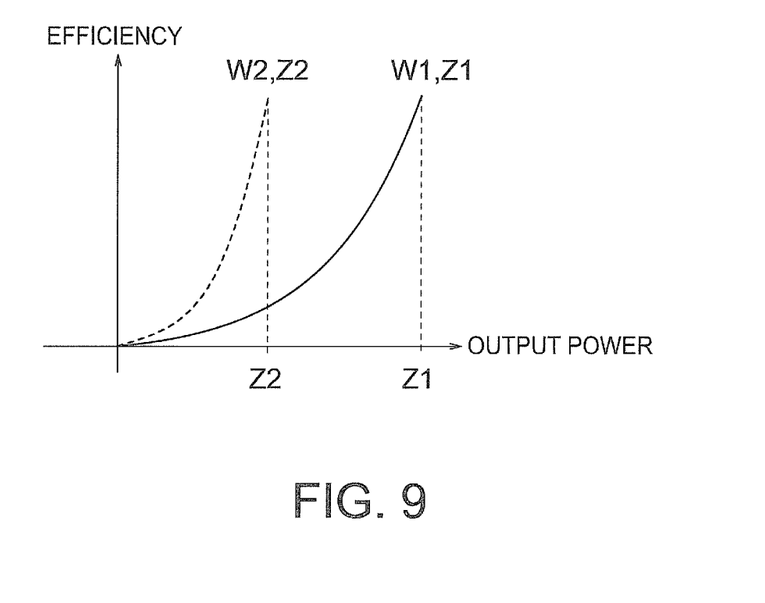
FIG. 9 is a diagram schematically showing a relationship between the output power and the efficiency.

FIG. 9 is a diagram schematically showing a relationship between the output power and the efficiency. A solid line shows that the impedance Z is set to be Z1 so that the efficiency becomes maximum when the gate width is W1. If the impedance Z is set to be Z1 when the gate width is W2 different from W1, the efficiency does not always become maximum. Therefore, the impedance Z should be set to be an optimum value Z2 for the gate width W being W2 as shown by a dashed line.

Hereinafter, how to control the impedance Z of the load 31 with respect to the gate width W, will be described.

In general, as the gate width W of the power amplifier 1 is smaller, the optimum impedance Z of the load 31 which makes the efficiency maximum becomes larger. More specifically, the gate width W is proportional to the optimum impedance Z. Therefore, the following equation (1) is obtained where k is a constant.

$$W*Z=k \tag{1}$$

When the relationship of (1) is satisfied, the efficiency becomes maximum.

Here, in the above described embodiments, the amplitude of the output signal of the power amplifier 1 is controlled so that the amplitude becomes constant. The amplitude of the output signal is proportional to a gain G. As a result, the gain G is controlled so as to be constant. The gain G is represented using the transconductance gm and the impedance Z as the following equation (2).

$$G=gm*Z \tag{2}$$

If a bias current is constant per a unit gate width, the transconductance gm is proportional to the gate width W. Therefore, the following equation (3) is obtained where A is a constant defined by a device and a bias current per a unit gate width.

$$G=A*W*Z \quad (3)$$

In the above described embodiments, G in the left-hand side is controlled so as to be constant. Therefore, as understood from the equation (3), W*Z is controlled so as to be constant. The W*Z is equal to k in the equation (1).

Accordingly, in the above described embodiments, even when the gate width W is variably controlled, the impedance Z of the load 31 seen from the power amplifier 1 is eventually controlled to be an optimum value according to the gate width automatically. Therefore, in FIG. 2 and so on, the power amplifier 1 whose gate width is variable can be used and further modification is not needed.

As stated above, in the fifth embodiment, the power amplifier 1 whose gate width W is variable is used. Therefore, the power can be saved when the output power is small and the efficiency can be large.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An amplification device comprising:
an input terminal into which an input signal is inputted;
a first amplifier configured to amplify the input signal to generate a first output signal;
an output terminal configured to output the first output signal to a load;
a variable impedance module connected at an output end of the first amplifier;
a second amplifier configured to amplify the input signal to generate a second output signal;
a reference impedance element connected at an output end of the second amplifier;
a magnitude comparator configured to generate a magnitude comparison signal according to a comparison result between a magnitude of the first output signal and a magnitude of the second output signal;
a phase comparator configured to generate a phase comparison signal according to a comparison result between a phase of the first output signal and a phase of the second output signal;
a controller configured to, based on the magnitude comparison signal and the phase comparison signal, control impedance of the variable impedance module so that impedance at a point between the first amplifier and the variable impedance approaches a first value; and
an attenuator configured to attenuate the magnitude of the first output signal according to a ratio between an amplification gain of a magnitude of the first amplifier and an amplification gain of a magnitude of the second amplifier, and to input the attenuated signal to the magnitude comparator,
wherein a power consumption of the second amplifier is lower than a power consumption of the first amplifier.

2. The device of claim 1, wherein the controller is configured to control the impedance of the variable impedance module so that the impedance at the point between the first amplifier and the variable impedance approaches an impedance of the reference impedance element.

3. The device of claim 1, wherein the phase comparator is configured to generate the phase comparison signal taking a difference between an input-output characteristic about a phase of the first amplifier and an input-output characteristic about a phase of the second amplifier into consideration.

4. The device of claim 1, wherein the controller is configured to control the impedance of the variable impedance module so that the impedance at the point between the first amplifier and the variable impedance approaches 50Ω.

5. The device of claim 1, wherein the first amplifier comprises a variable gate width.

6. A transmitter comprising:
an oscillation signal generation circuit configured to generate an oscillation signal;
a modulator configured to modulate a signal to be transmitted based on the oscillation signal;
a D-A converter configured to convert a signal outputted from the modulator to an analog signal; and
an amplification device configured to amplify the analog signal;
wherein the amplification device comprises:
an input terminal into which an input signal is inputted;
a first amplifier configured to amplify the input signal to generate a first output signal;
an output terminal configured to output the first output signal to a load;
a variable impedance module connected at an output end of the first amplifier;
a second amplifier configured to amplify the input signal to generate a second output signal;
a reference impedance element connected at an output end of the second amplifier;
a magnitude comparator configured to generate a magnitude comparison signal according to a comparison result between a magnitude of the first output signal and a magnitude of the second output signal;
a phase comparator configured to generate a phase comparison signal according to a comparison result between a phase of the first output signal and a phase of the second output signal;
a controller configured to, based on the magnitude comparison signal and the phase comparison signal, control impedance of the variable impedance module so that impedance at a point between the first amplifier and the variable impedance approaches a first value; and
an attenuator configured to attenuate the magnitude of the first output signal according to a ratio between an amplification gain of a magnitude of the first amplifier and an amplification gain of a magnitude of the second amplifier, and to input the attenuated signal to the magnitude comparator,
wherein a power consumption of the second amplifier is lower than a power consumption of the first amplifier.

7. The transmitter of claim 6, wherein the controller is configured to control the impedance of the variable impedance module so that the impedance at the point between the first amplifier and the variable impedance approaches an impedance of the reference impedance element.

8. The transmitter of claim 6, wherein the phase comparator is configured to generate the phase comparison signal taking a difference between an input-output characteristic about a phase of the first amplifier and an input-output characteristic about a phase of the second amplifier into consideration.

9. The transmitter of claim 6, wherein the controller is configured to control the impedance of the variable impedance module so that the impedance at the point between the first amplifier and the variable impedance approaches 50Ω.

* * * * *